SEALED FUNCTIONAL MOLECULAR ELECTRONIC DEVICE

Filed Aug. 9, 1962

WITNESSES:
Bernard R. Gregury
Raymond F. Majeske

INVENTORS
John E. Dereich and
Joseph M. Steiner.
BY
Frederick Shapoe
ATTORNEY

3,178,506
SEALED FUNCTIONAL MOLECULAR ELECTRONIC DEVICE

John E. Dereich, North Hills Estates, Pittsburgh, and Joseph M. Steiner, Franklin Township, Westmoreland County, Pa., assignors to Westinghouse Electric Corporation, East Pittsburgh, Pa., a corporation of Pennsylvania Filed Aug. 9, 1962, Ser. No. 215,857
7 Claims. (Cl. 174—52)

Figure 1:
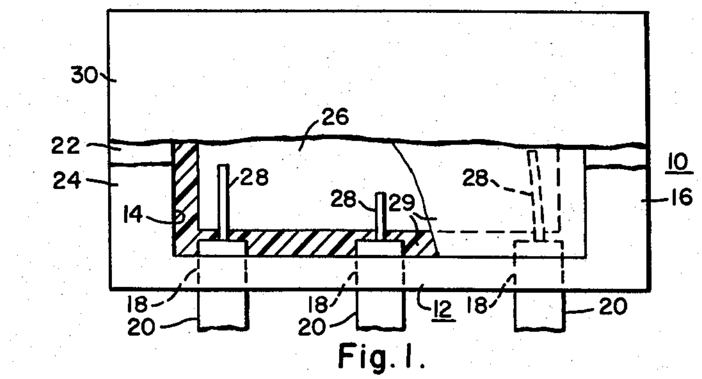

The present invention relates to a hermetically enclosed functional molecular electronic element.

Heretofore in the production of sealed semiconductor devices, a semiconductor element was usually soldered to a support member and a cap or header member was joined to the support to enclose the semiconductor element with various electrical insulating means and electrical leads for the semiconductor element integrated into the header member. Since the recent development of molecular electronics, the field has been rapidly expanding and the presently existing methods of packaging semiconductor devices are not suitable for packaging the miniaturized functional molecular electronic elements. When a new element is developed, especially a prototype, a package must be rapidly produced to enable the testing of such devices without expensive design and costly tooling. A functional molecular electronic device package is needed that may be rapidly fabricated to serve as an interim package for testing the newly produced prototypes and, in some cases, to serve as the final package.

One form of a molecular electronic element, as used hereinafter, is normally comprised of a body of semiconductor material, for example, germanium, silicon and stoichiometric III–V and II–VI compounds. The body may be comprised of one or more active regions, such as, a diode, transistor, four region two or three terminal devices or combinations thereof and the like, one or more regions functioning as a capacitance or a capacitance area disposed upon at least one surface of the body and one or more regions functioning as a resistance either fixed or variable. The body may also contain an inductance in addition to or in place of the resistance. The various regions and areas are connected in circuit relationship through the bulk of the body without external electrical connections. External electrical connections affixed to the body are limited to output, input and in some cases biasing or control leads.

Examples of such functional molecular electronic blocks can be found in patent applications, Serial Nos. 178,476, filed March 8, 1962; 176,723, filed March 1, 1962, and 89,498, filed February 15, 1961, all of which are assigned to the assignee of the present invention.

It will be understood that other functional electronic blocks, as produced by evaporation of semiconductor materials on glass or other electrically insulating material may be hermetically sealed and packaged as described.

The object of the present invention is to provide a hermetically sealed functional molecular electronic device comprising a cylindrical shell closed at one end thereof by a relatively flat base member, the base member and the shell being integrally connected and comprising a resinous material, the cylindrical shell having lateral apertures extending therethrough, a functional molecular electronic element disposed within the shell on the base member, electrical leads passing through the apertures in the shell and electrically connected to the electronic element proper, an insulating material disposed on the electronic element to hold it in place and to provide a hermetic seal therefor and a metallic cover plate joined to the open end of the cylindrical shell.

Other objects of the invention will, in part, be obvious and will, in part, appear hereinafter.

Figure 2:
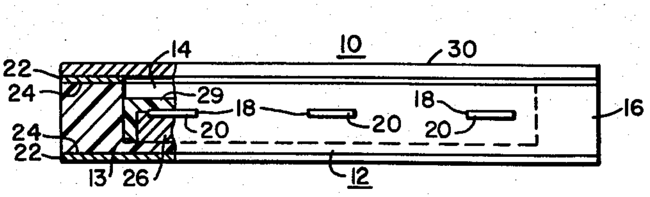

In order to more fully understand the nature and objects of the invention, reference should be made to the following detailed description and drawings, in which:

FIGURE 1 is a plan view partly broken of the enclosed functional molecular electronic device of the invention; and, FIG. 2 is an elevation view partly in cross-section of the device of the invention.

In accordance with the present invention and in attainment of the foregoing objects, there is provided a hermetically sealed functional molecular electronic device comprising a relatively flat base member with a cylindrical shell projecting therefrom to provide a central cavity extending from the upper surface thereof. The cylindrical shell has a plurality of apertures extending through the walls thereof for passing electrical leads therethrough. The base member may comprise a molded body of a resinous material, such as an inorganic fibrous material impregnated with a resinous composition for instance epoxy resins, polyester resins, silicones, or fluorinated organic resins. Examples of suitable fluorinated organic resins are polytetrafluoroethylene and polychlorotrifluoroethylene. A thin metallic coating may be applied on the flat outer surfaces of the base member, for instance, by cladding or coating, as by flame spraying to provide for good thermal conductivity and for soldering. The surfaces of the base member may be coated with a material such as copper and copper base alloys or silver and silver base alloys. A functional electronic element is disposed within the cavity and electrical leads are passed through the apertures in the shell and are electrically connected to the electronic element. A viscous insulating potting material either resinous or a low melting glass is disposed in the cavity, filling the cavity and if resinous, it is cured to solidification to hermetically seal the electronic element and to hold the element in place, and effectively seal the apertures containing the electrical leads. A metallic cover plate comprising, for instance, copper, silver, iron or aluminum or base alloys thereof is then joined by soldering to the exterior metallic coating on the surface of the open end of the cylindrical shell.

Referring to FIGURES 1 and 2 there is shown the hermetically sealed functional molecular electronic device 10 of the invention. A device 10 comprises a relatively flat base member 12 with an upwardly extending cylindrical shell 16 having a central cavity 14. The shell 16 contains a plurality of apertures 18 extending through its walls and a plurality of electrical leads 20 pass through the apertures. The base member comprises a resinous material and has a relatively thin metallic coating 22 on the flat upper and lower outer surfaces 24. The sides can be metallized except in the area around the leads 20. A functional molecular electroniic element 26 is disposed on the upper surface 13 of the base member 12 within the cavity 14 and the electrical leads 20 are electrically connected to the electronic element 26 by means of electrical conductors 28. A solidified insulating potting material 29 is disposed in the cavity and fills the cavity to hermetically seal and hold the electronic element 26 in place and effectively seal the apertures 18 containing the electrical leads 20. A metallic cover plate 30 is joined as by soldering to the metallic coating 22 on the upper surface defined by the end of the cylindrical shell 16.

It should be understood that the base member contaínining the cavity may be produced by casting a resinous material in a die having a cavity impression wherein the cavity if formed after solidification or by merely casting a block of resinous material and subsequently machining out the cavity area. The latter method, being more adaptable for development prototypes is preferred by applicants.

The following examples are illustrative of the teachings of the invention.

*Example I*

A block of resinous material was cast in a die cavity to the dimensions of 0.165 by 0.085 by 0.018 inch. The resinous material comprised an epoxy fiber glass laminate. The resinous block was machined to provide a downwardly extending cavity having the dimensions 0.130 by 0.065 by 0.016 inch and a plurality of apertures were machined in the side walls of the cavity, the dimensions of the apertures being approximately 0.010 by 0.004 inch. A metallic coating comprising copper was flame sprayed on the flat outer surfaces of the machined member. A functional molecular electronic block (.120 by .055 by .009 inch) was disposed in the cavity and a plurality of gold plated silver leads (.010 by .004 by .5 inch) were disposed in the apertures and electrically connected to the electronic element. The cavity was then filled with an epoxy resin to hermetically seal the electronic element, to hold the element in place and the seal off the apertures containing the electrical leads. A cover plate comprising a nickel-cobalt-iron alloy selling under the tradename Kovar was then joined by soldering to the metallic coating on the outer upper surface, previously metallized, of the end of the cylindrical shell. The overall thickness of the device was .030 inch. The device was tested and the results obtained were satisfactory.

*Example II*

A device, in all respects the same as that described in Example I, is produced by providing a flat slab or block of a polytetrafluoroethylene material and machining out a cavity. After assembling and joining all of the other component parts, as employed in Example I, the device may be utilized in an electrical circuit. The flat surfaces were metallized by flame spraying and apertures were cut through the side walls of the cavity.

*Example III*

A sheet of glass fiber-epoxy resin laminate with 3 mil copper foil applied to both faces, and a total thickness of 0.040 inch is cut into rectangles 0.20 x 0.10 inch and a cavity is machined into the upper surface to a depth of 0.030 inch. Circular holes were drilled into the sides and electrical leads inserted therein. An electronic component is placed in the cavity and heat curable epoxy resin is poured in to seal the component and to seal the apertures about the electrical leads. After curing the epoxy resin, the open top is sealed by soldering a copper sheet thereto. The hermetically sealed device so produced can be soldered at its bottom copper foil surface to a base.

It is intended that the above description and drawings be interpreted as illustrative and not limiting.

We claim as our invention:

1. A hermetically sealed electronic device comprising a relatively flat base member having upwardly extending walls and a closed bottom defining a central cavity, apertures extending through the upwardly extending walls, the base member comprising a resinous material and having a thin metallic coating on the flat outer surfaces thereof, an electronic element disposed within the cavity, electrical leads passing through the apertures in the walls and electrically connected to the electronic element, a solidified insulating potting material within the cavity that, in cooperation with said hose member, hermetically seals the electronic element and effectively seals the apertures containing the electrical leads so as to hold the element in place and a metallic cover plate joined to the metallic coating on the outer surface of said base member that surrounds the cavity.

2. A hermetically sealed electronic device comprising a relatively flat base member having upwardly extending walls and a closed bottom defining a central cavity, apertures extending through the upwardly extending walls, the base member comprising a molded body comprising inorganic fibrous material impregnated with a resinous composition and having a thin metallic coating on the flat outer surfaces thereof, an electronic element disposed within the cavity, electrical leads passing through the apertures in the walls of the shell and electrically connected to the electronic element a solidified insulating potting material within the cavity and, in cooperation with said base member, hermetically sealing the electronic element and effectively sealing the apertures containing the electrical leads so as to hold the element in place and a structural cover plate joined to the metallic coating on the outer surface of said base member that surrounds the cavity.

3. A hermetically sealed functional molecular electronic device comprising a relatively flat base member having a central cavity extending from the upper surface thereof, whereby to provide an upwardly extending cylindrical shell with a closed bottom, apertures extending through the walls of the cylindrical shell, the base member comprising a resin impregnated glass cloth laminate and having a thin metallic coating on the flat outer surfaces thereof, a functional molecular electronic element disposed within the cavity, electrical leads passing through the apertures in the walls of the shell and electrically connected to the electronic element, a solidified insulating potting material filling the cavity and hermetically sealing the electronic element and effectively sealing the apertures containing the electrical leads so as to hold the element in place and a metallic cover plate joined to the metallic coating on the upper surfaces defined by the end of the cylindrical shell.

4. A hermetically sealed functional molecular electronic device comprising a relatively flat base member having a central cavity extending from the upper surface thereof, whereby to provide an upwardly extending cylindrical shell with a closed bottom, apertures extending through the walls of the cylindrical shell, the base member comprising an epoxy fiber glass laminate material and having a thin metallic coating of a copper base alloy on the flat outer surfaces thereof, a functional molecular electronic element disposed within the cavity, electrical leads passing through the apertures in the walls of the shell and electrically connected to the electronic element, a solidified insulating potting material filling the cavity and hermetically sealing the electronic element and effectively sealing the apertures containing the electrical leads so as to hold the element in place and a metallic cover plate comprising a copper base alloy joined to the metallic coating on the upper surfaces defined by the end of the cylindrical shell.

5. A hermetically sealed functional molecular electronic device comprising a relatively flat base member having a central cavity extending from the upper surface thereof, whereby to provide an upwardly extending cylindrical shell with a closed bottom, apertures extending through the walls of the cylindrical shell, the base member comprising a fluorinated organic resin and having a thin metallic coating on the flat outer surfaces thereof; a functional molecular electronic element disposed within the cavity, electrical leads passing through the apertures in the walls of the shell and electrically connected to the electronic element, a solidified insulating potting material filling the cavity and hermetically sealing the electronic element and effectively sealing the apertures containing the electrical leads so as to hold the element in place and a metallic cover plate jointed to the metallic coating on the upper surfaces defined by the end of the cylindrical shell.

6. A hermetically sealed functional molecular electronic device comprising a relatively flat base member having a central cavity extending from the upper surface thereof, whereby to provide an upwardly extending cylindrical shell with a closed bottom, apertures extending through the walls of the cylindrical shell, the base member comprising a polytetrafluoroethylene and having a thin metallic coating of copper on the flat outer surfaces thereof, a functional molecular electronic element disposed within the cavity, electrical leads passing through the apertures in the walls of the shell and electrically connected to the electronic element, a solidified insulating potting material filling the cavity and hermetically sealing the electronic element and effectively sealing the apertures containing the electrical leads so as to hold the element in place and a copper cover plate joined to the metallic coating on the upper surfaces defined by the end of the cylindrical shell.

7. A hermetically sealed functional molecular electronic device comprising a relatively flat base member having a central cavity extending from the upper surface thereof, whereby to provide an upwardly extending cylindrical shell with a closed bottom, apertures extending through the cylindrical shell, the base member comprising a polychlorotrifluorethylene and having a thin metallic coating of copper on the flat outer surfaces thereof, a functional molecular electronic element disposed within the cavity, electrical leads passing through the apertures in the shell and electrically connected to the electronic element, a solidified insulating potting material filling the cavity and hermetically sealing the electronic element and effectively sealing the apertures containing the electrical leads so as to hold the element in place and a metallic cover plate comprising a copper base alloy joined to the metallic coating on the upper surfaces defined by the end of the cylindrical shell.

References Cited by the Examiner

UNITED STATES PATENTS

| | | | |
|---|---|---|---|
| 2,295,990 | 9/42 | Fridgen | 174—50.5 |
| 2,901,529 | 8/59 | Rudner | 174—152 |
| 2,921,244 | 1/60 | Emeis | 317—174 |
| 2,930,904 | 3/60 | Fritts | 174—52 |
| 2,945,163 | 7/60 | Kilby et al. | 174—68.5 |
| 2,971,138 | 2/61 | Meisel et al. | 317—101 |
| 2,989,669 | 6/61 | Lathrop | 317—101 |
| 2,999,964 | 9/61 | Glickman | 174—52 |
| 3,001,113 | 9/61 | Mueller | 317—234 |
| 3,024,519 | 3/62 | Leinkram | 317—234 |
| 3,094,585 | 6/63 | Rudner | 174—152 |

JOHN F. BURNS, *Primary Examiner.*